United States Patent
Yao et al.

(10) Patent No.: US 10,236,764 B2
(45) Date of Patent: Mar. 19, 2019

(54) SNUBBER CIRCUITS FOR POWER CONVERTERS

(71) Applicant: Astec International Limited, Kwun Tong, Kowloon (HK)

(72) Inventors: Jun Yao, Shen Zhen (CN); Fan Zheng Zeng, Shen Zhen (CN); Hua Sheng, Shen Zhen (CN)

(73) Assignee: Astec International Limited, Kowloon (HK)

( * ) Notice: Subject to any disclaimer, the term of this patent is extended or adjusted under 35 U.S.C. 154(b) by 0 days.

(21) Appl. No.: 15/753,107

(22) PCT Filed: Sep. 30, 2016

(86) PCT No.: PCT/CN2016/101270
§ 371 (c)(1),
(2) Date: Feb. 15, 2018

(87) PCT Pub. No.: WO2018/058607
PCT Pub. Date: Apr. 5, 2018

(65) Prior Publication Data
US 2018/0375425 A1  Dec. 27, 2018

(51) Int. Cl.
*H02M 1/34* (2007.01)
*H02M 3/158* (2006.01)
(Continued)

(52) U.S. Cl.
CPC ............ *H02M 1/34* (2013.01); *H02M 3/158* (2013.01); *H03K 17/0822* (2013.01); *H03K 17/08142* (2013.01); *H02M 2001/342* (2013.01)

(58) Field of Classification Search
CPC .................................. H02M 1/32; H02M 1/34
See application file for complete search history.

(56) References Cited

U.S. PATENT DOCUMENTS

| | | |
|---|---|---|
| 4,912,620 A | 3/1990 | O'Dell |
| 5,982,638 A | 11/1999 | Tang et al. |

(Continued)

FOREIGN PATENT DOCUMENTS

| | | |
|---|---|---|
| CN | 2462612 Y | 11/2001 |
| CN | 1731661 A | 2/2006 |

(Continued)

*Primary Examiner* — Adolf Berhane
*Assistant Examiner* — Afework Demisse
(74) *Attorney, Agent, or Firm* — Harness, Dickey & Pierce, P.L.C.

(57) ABSTRACT

A power converter for converting an input power at an input of the converter to an output power at an output of the converter includes a power conversion circuit and a snubber circuit coupled to the power conversion circuit. The power conversion circuit includes a switching device coupled to a reference potential, and an inductance coupled to the switching device. The snubber circuit includes a snubber switching device, a capacitance coupled to the snubber switching device, and an auxiliary inductance coupled to the inductance of the power conversion circuit and the snubber switching device. The snubber switching device and the capacitance are coupled across the switching device of the power conversion circuit. The capacitance is adapted to store leakage energy output from the power conversion circuit and discharge at least a portion of the stored leakage energy via the snubber switching device. Other example power converters are also disclosed.

12 Claims, 4 Drawing Sheets

(51) Int. Cl.
*H03K 17/082* (2006.01)
*H03K 17/0814* (2006.01)

(56) References Cited

U.S. PATENT DOCUMENTS

| | | | |
|---|---|---|---|
| 5,986,904 A | 11/1999 | Jacobs et al. | |
| 6,980,447 B1 | 12/2005 | Schaible et al. | |
| 7,385,833 B2 * | 6/2008 | Keung | H02M 3/158 323/222 |

FOREIGN PATENT DOCUMENTS

| | | | |
|---|---|---|---|
| CN | 103051179 A | 4/2013 | |
| CN | 105450032 A | 3/2016 | |

* cited by examiner

SNUBBER CIRCUITS FOR POWER CONVERTERS

FIELD

The present disclosure relates to snubber circuits for power converters.

BACKGROUND

This section provides background information related to the present disclosure which is not necessarily prior art.

Power converters sometimes include snubber circuits to absorb energy from inductive components in the power converters. This can help suppress voltage spikes across switches in the power converters that may otherwise damage the switches. Sometimes, the snubber circuits are coupled across switches to provide an alternative current path so that energy from the inductive components can discharge through the snubber circuits, not the switches.

SUMMARY

This section provides a general summary of the disclosure, and is not a comprehensive disclosure of its full scope or all of its features.

According to one aspect of the present disclosure, a power converter for converting an input power at an input of the converter to an output power at an output of the converter includes a power conversion circuit and a snubber circuit coupled to the power conversion circuit. The power conversion circuit includes a switching device coupled to a reference potential, and an inductance coupled to the switching device. The snubber circuit includes a snubber switching device, a capacitance coupled to the snubber switching device, and an auxiliary inductance coupled to the inductance of the power conversion circuit and the snubber switching device. The snubber switching device and the capacitance are coupled across the switching device of the power conversion circuit. The capacitance is adapted to store leakage energy output from the power conversion circuit and discharge at least a portion of the stored leakage energy via the snubber switching device.

Further aspects and areas of applicability will become apparent from the description provided herein. It should be understood that various aspects of this disclosure may be implemented individually or in combination with one or more other aspects. It should also be understood that the description and specific examples herein are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts and/or features throughout the several views of the drawings.

DETAILED DESCRIPTION

Figure 1:
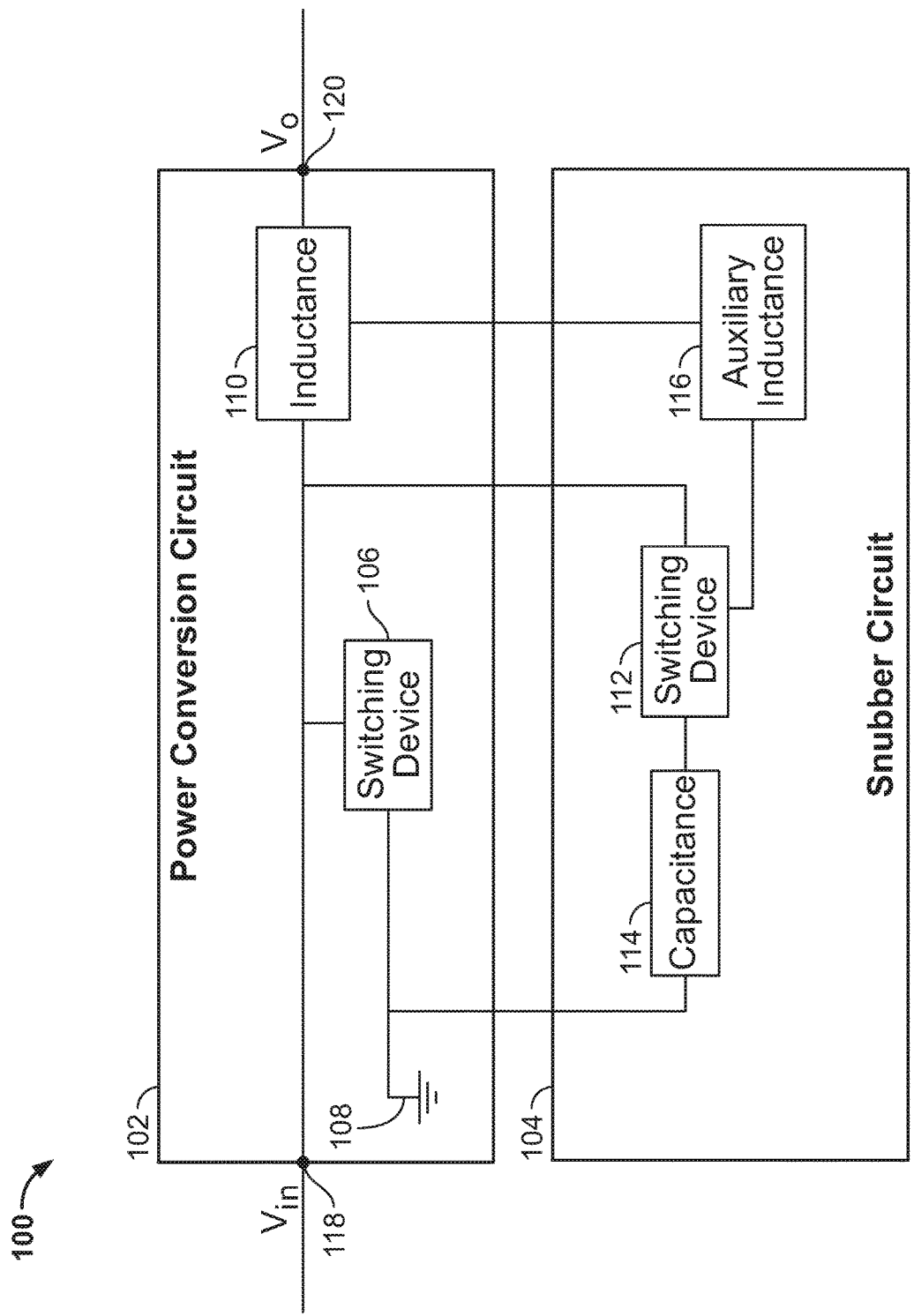
FIG. 1 is a block diagram of a power converter including a power conversion circuit and a snubber circuit according to one example embodiment of the present disclosure.

Example embodiments will now be described more fully with reference to the accompanying drawings.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

A power converter for converting an input power at the converter's input into an output power at the converter's output according to one example embodiment of the present disclosure is illustrated in FIG. 1 and indicated generally by reference number 100. As shown in FIG. 1, the power converter 100 includes a power conversion circuit 102 and a snubber circuit 104 coupled to the power conversion circuit 102. The power conversion circuit 102 includes a switching device 106 coupled to a reference potential 108, and an inductance 110 coupled to the switching device 106. The snubber circuit 104 includes a snubber switching device 112, a capacitance 114 coupled to the snubber switching device 112, and an auxiliary inductance 116 coupled to the inductance 110 of the power conversion circuit 102 and the snubber switching device 112. As shown, the snubber switching device 112 and the capacitance 114 are coupled across the switching device 106 of the power conversion circuit 102. The capacitance 114 stores leakage energy output from the power conversion circuit 102 and discharges at least a portion of the stored leakage energy via the snubber switching device 112.

By employing the snubber circuit 104, voltage spikes across the power conversion circuit's switching device 106 can be reduced and in some cases eliminated. This is due to the capacitance 114 storing and discharging leakage energy for defined periods of time so that at least a portion of the leakage energy (and in some cases the entire leakage energy) is not applied to the switching device 106. As such, stress on the switching device 106 due to a voltage increase may be reduced.

Additionally and as further explained below, the snubber circuit 104 can function as a substantially lossless snubber circuit. For example, the snubber circuit 104 may consume less power (including no power) as compared to other known snubber circuits. As further explained below, the reduced power loss may be due to, for example, employing low power loss components such as transistors, etc. in the snubber circuit 104, using an auxiliary winding (e.g., the auxiliary inductance 116, etc.) of an inductive component to power the snubber circuit 104 (e.g., drive the switching device 112), etc.

For example, using the auxiliary inductance 116 to power the snubber circuit 104 can help control the timing of the snubber circuit 104 (e.g., the switching of the switching device 112). In such examples, the switching device 112 can be controlled to follow the switching of the power conversion circuit's switching device 106. This may allow the snubber circuits switching device 112 to achieve soft switching, and in turn the snubber circuit 104 can experience reduced power losses. Additionally, due to the timing control of the snubber circuit 104, a driver circuit is not needed to drive the switching device 112. As such, less auxiliary power components are needed in the snubber circuit 104.

As shown in FIG. 1, the power converter 100 includes an input 118 for receiving an input voltage Vin and an output 120 for providing an output voltage Vo to a load (not shown). The switching device 106 may receive the input voltage Vin, as shown in FIG. 1, and/or another voltage based on the input voltage Vin. For example, the power conversion circuit 102 may include one or more components not shown in FIG. 1, including but not limited to power switches, etc. for converting the input voltage Vin into another voltage (e.g., the output voltage Vo, an intermediate voltage, etc.) that is received by the switching device 106.

As explained above, the capacitance 114 can store leakage energy output from the power conversion circuit 102. For example, the power conversion circuit 102 can include one or more inductive components that leak stored energy. In some embodiments, the power conversion circuit 102 includes a transformer. In such examples, at least a portion of the energy stored in the transformer is released and stored in the capacitance 114.

After a period of time, this stored energy in the capacitance 114 can be discharged. For example, energy stored in the capacitance 114 can be discharged through the snubber switching device 112, the inductance 110 and a load (not shown) coupled to the power converter 100.

As explained above, the snubber switching device 112 and the capacitance 114 are coupled across the switching device 106 of the power conversion circuit 102. For example, and as shown in FIG. 1, a series combination of the snubber switching device 112 and the capacitance 114 is coupled in parallel with the switching device 106 of the power conversion circuit 102.

As explained above, the auxiliary inductance 116 is coupled to the inductance 110. For example, the auxiliary inductance 116 and the inductance 110 can be magnetically coupled together. In some embodiments, the inductance 110 and the auxiliary inductance 116 may be windings of an output choke of the power converter 100.

The switching devices 106, 112 of FIG. 1 can be any suitable switching device. In some embodiments, one or both switching devices may be a diode. In other embodiments, one or both switching devices may be an active component such as a transistor (e.g., a metal-oxide-semiconductor field-effect transistor (MOSFET) such as an nMOS transistor, a pMOS transistor, etc.).

Figure 2:
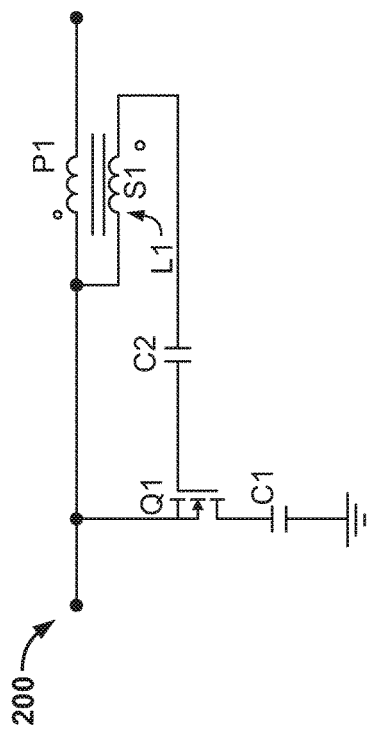
FIG. 2 is a circuit diagram of a snubber circuit including a transistor and a capacitor coupled in series according to another example embodiment.

For example, FIG. 2 illustrates another snubber circuit 200 utilizing an nMOS transistor Q1 as a snubber switching device. As shown in FIG. 2, the snubber circuit 200 includes the transistor Q1, capacitors C1, C2, and an auxiliary winding S1.

As shown in FIG. 2, the auxiliary winding S1 is a portion of a choke L1. In the particular example of FIG. 2, the choke L1 includes a primary winding P1 and the auxiliary winding S1 magnetically coupled together. The primary winding P1 and the auxiliary winding S1 of FIG. 2 may be substantially similar to the auxiliary inductance 116 and the inductance 110, respectively, of FIG. 1. Although not shown, the primary winding P1 may be coupled between one or more components of a power conversion circuit. In such examples, the choke L1 can be considered an output choke of a power converter including the snubber circuit 200, as explained above.

In the example embodiment of FIG. 2, the transistor Q1 is coupled between the choke L1 and a capacitor C1, and to a capacitor C2. For example, a source terminal of the transistor Q1 is coupled to the choke L1 (e.g., both the winding P1 and the auxiliary winding S1), a drain terminal of the transistor Q1 is coupled to the capacitor C1 and a gate terminal of the transistor Q1 is coupled to the auxiliary winding S1 via the capacitor C2. Therefore, one side of the auxiliary winding S1 is coupled to the source terminal and the other side of the auxiliary winding S1 is coupled to the gate terminal.

The capacitor C1 and the transistor Q1 are coupled in series with each other. For example, and as shown in FIG. 2, the capacitor C1 is coupled on one side to the transistor Q1 (e.g., the drain terminal of the transistor Q1) and on the other side to a reference potential. As such, the capacitor C1 is coupled between the drain terminal of the transistor Q1 and the reference potential.

In the particular example of FIG. 2, the auxiliary winding S1 powers the snubber circuit 200. For example, and as shown in FIG. 2, the auxiliary winding S1 (which forms an LC tank circuit with the capacitor C2) is used to control the switching cycle of the transistor Q1. In such examples, the auxiliary winding S1 and the capacitor C2 can be selected to ensure the transistor Q1 is controlled appropriately so that the capacitor C1 stores a desired amount of energy leaked from the power conversion circuit, and discharges a desired amount of energy, as further explained below. For example, and as further explained below, a particular inductance value of the auxiliary winding S1 and a particular capacitance value of the capacitor C2 can be selected to ensure the transistor Q1 is on or off for defined period of times to store energy and/or discharge stored energy.

Figure 3:
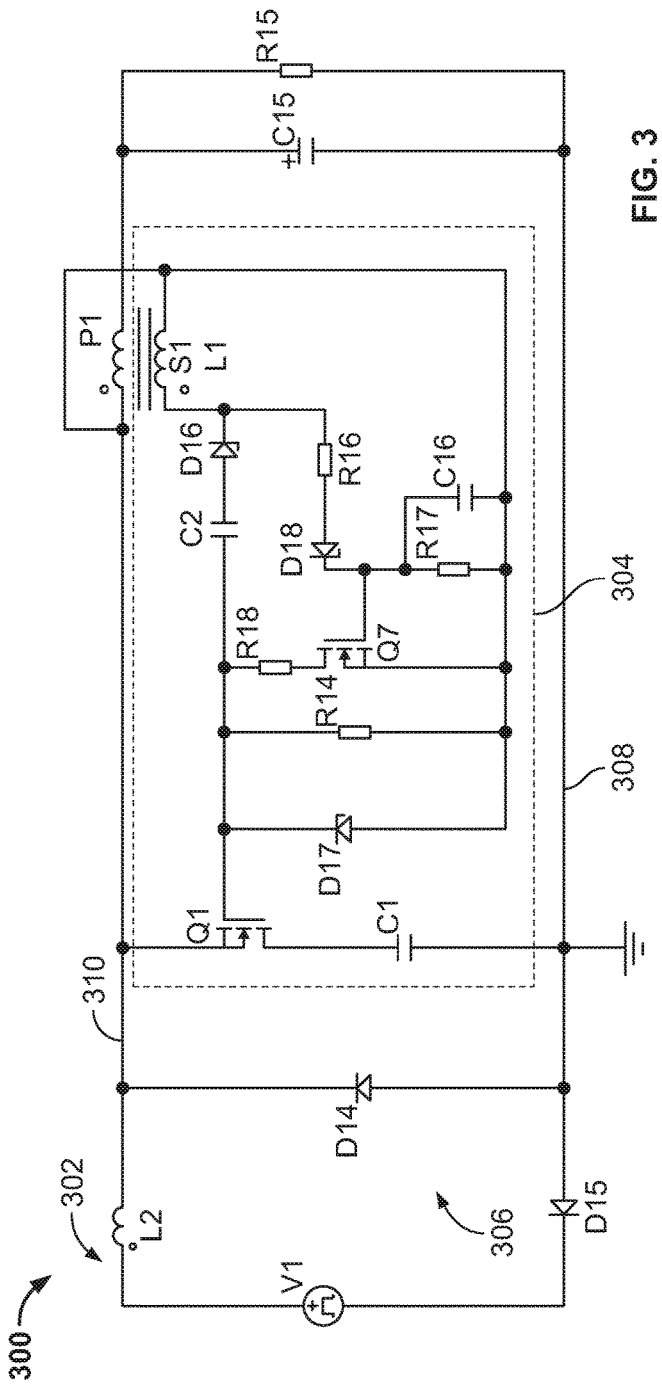
FIG. 3 is a circuit diagram of a power converter including a portion of a power conversion circuit and a snubber circuit powered by an inductance according to yet another example embodiment.

FIG. 3 illustrates a portion of a power converter 300 including a portion of a power conversion circuit 302 having a voltage source V1, a snubber circuit 304 coupled to the power conversion circuit 302, and an LC filter coupled to a load (e.g., resistor R15). As shown in FIG. 3, the power conversion circuit 302 includes a rectification circuit 306 coupled to the load via the LC filter. In the particular example of FIG. 3, the LC filter includes the winding P1 of the choke L1 of FIG. 2 and a capacitor C15 coupled across the load.

In the particular example of FIG. 3, the voltage provided by the voltage source V1 is the secondary side voltage of a transformer (not shown). In such examples, the inductance L2 coupled between the voltage source V1 and the choke L1 represents a leakage inductance of that transformer.

As shown in FIG. 3, the rectification circuit 306 includes diodes D14 and C15. The diode D15 (e.g., the rectifying diode) is coupled in a reference rail (e.g., a negative rail) 308 of the power converter 300 and the diode D14 (e.g., the freewheeling diode) is coupled between the reference rail 308 and a positive rail 310 of the power converter 300. As shown, the anodes of the diodes D14 and D15 are coupled together, the cathode of the diode D14 is coupled to the positive rail 310 and the cathode of the diode D15 is coupled to the reference side of the voltage source V1.

In operation, when the voltage source V1 provides a positive voltage (e.g., a high voltage), the diode D15 turns on and current flows through the choke L1, the capacitor C15 and the load resistor R15. This can take place during the on time of the power conversion circuit's power switch(es). When the voltage source V1 outputs zero voltage (e.g., during an off time of the power conversion circuit's power switch(es)), the diode D15 turns off and the freewheeling diode D14 turns on. This allows stored energy in the winding P1 and the capacitor C15 to flow through the choke L1, the capacitor C15 and the load resistor R15.

As shown in FIG. 3, the rectification circuit 306 receives a voltage from the voltage source V1. This voltage may be an intermediate voltage of the power converter 300. For example, the power conversion circuit 302 may include one or more power switches and a transformer (not shown) coupled to the rectification circuit 306. As such, the voltage provided by the voltage source V1 may represent the secondary side voltage of the transformer. In such examples, the voltage from the voltage source V1 may be equal to a primary side voltage of the transformer (V_bulk) multiplied by the turns ratio (N) of the transformer. In some embodiments, the transformer's primary side voltage may be an input voltage, a voltage provided by a power factor correction (PFC) stage, etc.

The snubber circuit 304 of FIG. 3 includes the transistor Q1 (e.g., a snubber switching device), the capacitors C1, C2 and the auxiliary winding S1 (of the choke L1) of FIG. 2, and a diode D16. The capacitor C2 is coupled between the transistor Q1 and the diode D16. The transistor Q1 (e.g., the gate terminal of the transistor Q1) is coupled to the auxiliary winding S1 via the diode D16. As such, the auxiliary winding S1 is used to power the snubber circuit 304 (e.g., the transistor Q1), as explained above.

In addition to the transistor Q1, the capacitors C1, C2, the auxiliary winding S1 and the diode D16, the snubber circuit 304 in the particular example of FIG. 3 further includes resistors R14, R16, R17, R18, diodes D17, D18, a capacitor C16 and a transistor Q7. The resistor R16 is coupled between the auxiliary winding S1 and the diode D18. The resistor R17 and the capacitor C16 are coupled in parallel, and between the diode D18 and the auxiliary winding S1. The transistor Q7 and the resistor R18 are coupled in series. The gate terminal of the transistor Q7 is coupled to the parallel combination of the resistor R17 and the capacitor C16, and the diode D18. The series combination of the transistor Q7 and the resistor R18 are coupled in parallel with the resistor R14 and the diode D17. The transistor Q7 is coupled to the transistor Q1 via the resistor R18.

The capacitor C1 can store leakage energy output from the power conversion circuit and discharge at least a portion of the stored leakage energy via the transistor Q1. In the particular example of FIG. 3, because the transformer produces the leakage energy (represented by the inductance L2), the capacitor C1 can store the leakage energy provided by the transformer.

For example, when the voltage source V1 provides a positive voltage (as explained above), current passing through the choke L1 will increase and the voltage across the auxiliary winding S1 will be positive. During this time, the capacitor C1 begins to absorb and store leakage energy from, for example, the transformer via a body diode (not shown) of the transistor Q1. As a result, this energy is not seen by the diode D14 (e.g., a switching device of the power conversion circuit 302). Therefore, voltage spikes across the diode D14 due to this leakage energy are reduced.

The increasing current passing through the choke L1 (and therefore the auxiliary winding S1) causes the voltage at the gate of the transistor Q1 to increase. Once the voltage at the gate of the transistor Q1 has increased above the transistor's saturation point, the transistor Q1 turns on (e.g., is closed). This voltage increase to above the transistor's saturation point may take a defined period of time (T1) based on, for example, the inductance value of the choke L1, the capacitance value of the capacitor C2, etc. As such, the transistor Q1 is off, and the capacitor C1 can absorb and store leakage energy for that defined period of time (T1).

When the transistor Q1 turns on, the capacitor C1 can discharge at least a portion of the stored leakage energy through the transistor Q1. For example, stored energy can be discharged from the capacitor C1, and pass through the transistor Q1, the choke L1, the capacitor C15 and the load resistor R15.

Additionally, during this time a voltage across the capacitor C16 begins to increase (e.g., the capacitor C16 is charging). Once the voltage across the capacitor C16 increases above a saturation point of the transistor Q7, the transistor Q7 turns on (e.g., is closed). This causes the voltage at the gate of the transistor Q1 to fall below its cutoff voltage. Therefore, the transistor Q7 can in part control the transistor Q1 (e.g., the snubber switching device). As such, when the transistor Q7 turns on, the transistor Q1 turns off (e.g., is opened) and the capacitor C1 begins to absorb and store leakage energy (as explained above).

The voltage increase across the capacitor C16 to above the saturation point of the transistor Q7 may take a defined period of time (T2) based on, for example, the values of the capacitances, inductances, etc. in the snubber circuit 304. As such, the transistor Q1 may be on, and the capacitor C1 can discharge stored leakage energy for that defined period of time (T2).

After the transistor Q7 turns on and the transistor Q1 turns off, the capacitor C16 begins to discharge. After some period of time, the voltage at the gate of the transistor Q7 falls below the transistor's cutoff voltage (e.g., due to the capacitor C16 discharging). This causes the transistor Q7 to turn off (e.g., to open). Subsequently, the transistor Q1 turns back on and the capacitor C1 begins to discharge its stored energy, as explained above.

In some preferred embodiments, the defined period of time (T2) is substantially equal to the defined period of time (T1). Therefore, because the switching cycles of the transistors Q1, Q7 correspond to the defined period of times (T1, T2) as explained above, the switching cycles of the transistors may be the same. For example, the switching cycles for the transistors Q1, Q7 may be about 500 ns, more or less than 500 ns, etc. In other embodiments, the defined period of time (T2) may be different than the defined period of time (T1).

One or both defined period of times can be set to any suitable value. For example, the defined period of time (T2) (e.g., the period of time in which the capacitor C1 discharges) can be set so that the capacitor C1 discharges to a voltage plateau equal to about V_bulk*N or another suitable level.

Additionally, the diode D16 (e.g., shown as a Zener diode) can function as a clamping diode that clamps a voltage across the capacitor C1. For example, the voltage across the capacitor C1 can be clamped at a specific value based on the particularly rated Zener diode D16. In such examples, if the voltage on the capacitor C1 is discharging to the voltage plateau, the voltage on the Zener diode D16 may become lower than its conductive voltage (e.g., when the voltage on the capacitor C1 reaches the voltage plateau). This causes the transistor Q1 to open and the capacitor C1 stops discharging. As such, the diode D16 clamps the voltage across the capacitor C1 at the voltage plateau. In the particular example of FIG. 3, the diode D16 actively clamps the voltage across the capacitor C1 by using the transistor Q1 (e.g., an active device).

In some embodiments, the capacitor C1 may be restricted from discharging its stored energy. For example, during startup of the power converter 300, the transistor Q7 can control the transistor Q1 so the capacitor C1 is restricted from discharging stored energy via the transistor Q1. In particular, during a soft start of the power converter 300, the output voltage of the power converter 300 may be less than a desired regulated level. In such cases, the lower output voltage may cause the voltage on the diode D18 (e.g., shown as a Zener diode) to fall below its conductive voltage. This prevents the diode D18 from conducting, and in turn energy in the capacitor C16 cannot discharge. As such, the transistor Q7 cannot turn off and the transistor Q1 cannot turn on, as explained above. As a result, the capacitor C1 is restricted from discharging stored energy via the transistor Q1. This can prevent a high voltage stress on the freewheeling diode D14.

Figure 4:
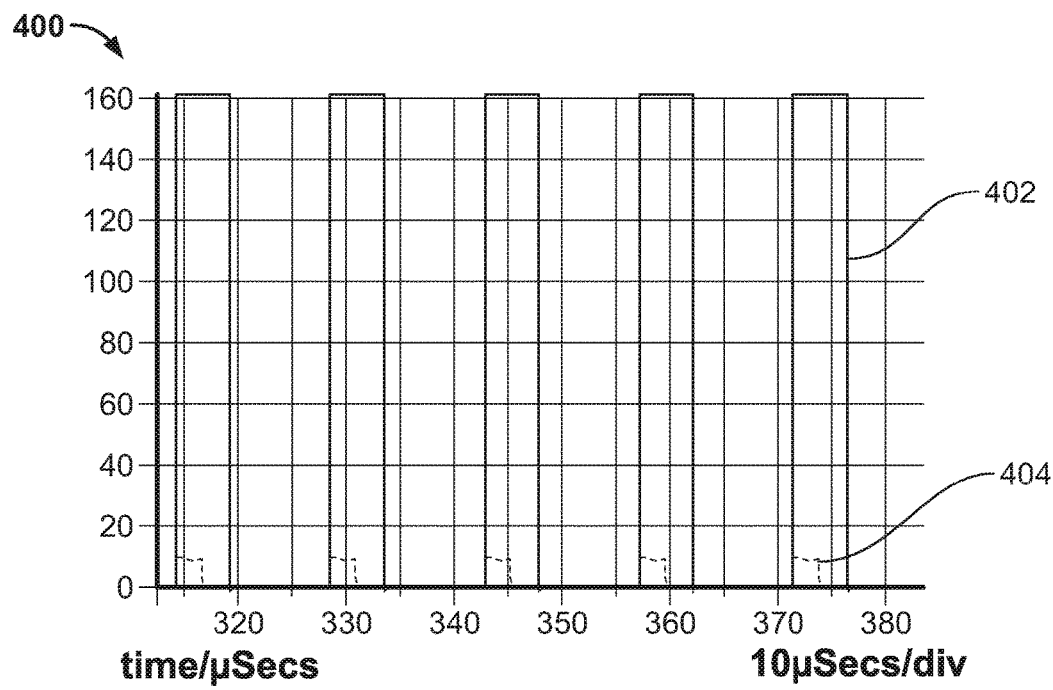
FIG. 4 is a graph of a waveform representing a voltage provided by a voltage source in the power converter of FIG. 3, and a waveform representing a voltage at a snubber switching device of the power converter of FIG. 3.
Figure 5:
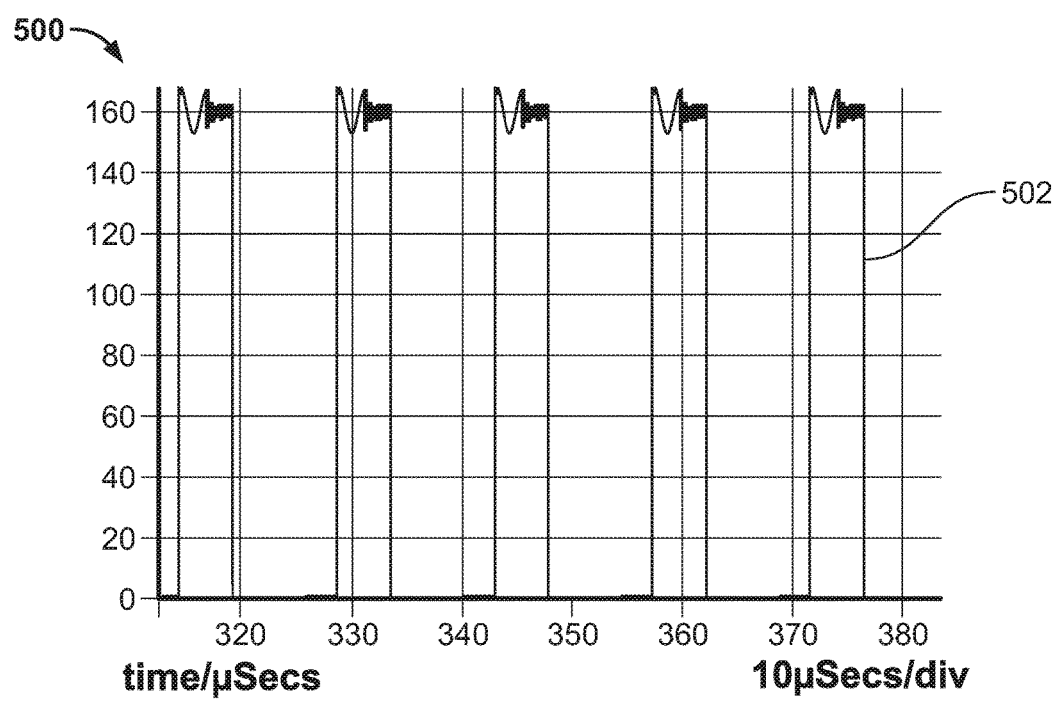
FIG. 5 is a graph of a waveform representing a voltage across a switching device of the power conversion circuit of FIG. 3.

FIGS. 4 and 5 illustrate graphs 400 and 500, respectively, related to the power converter 300 of FIG. 3. As shown in FIG. 4, the graph 400 includes a waveform 402 representing the voltage from the voltage source V1 of FIG. 3, and a waveform 404 representing the voltage from gate to source (Vgs) of the transistor Q1 of FIG. 3. When the voltage Vgs is high, the transistor Q1 is on and the capacitor C1 of FIG. 3 is discharging, as explained above. Conversely, when the voltage Vgs is low, the transistor Q1 is off and the capacitor C1 is absorbing and storing leakage energy from the power conversion circuit 302, as explained above.

The graph 500 includes a waveform 502 representing the voltage across the freewheeling diode D14. The voltage across the freewheeling diode D14 experiences reduced voltage spikes (compared to converters not employing the snubber circuit 304) due to the capacitor C1 absorbing and storing leakage energy and then discharging the stored energy, as explained above.

Figure 6:
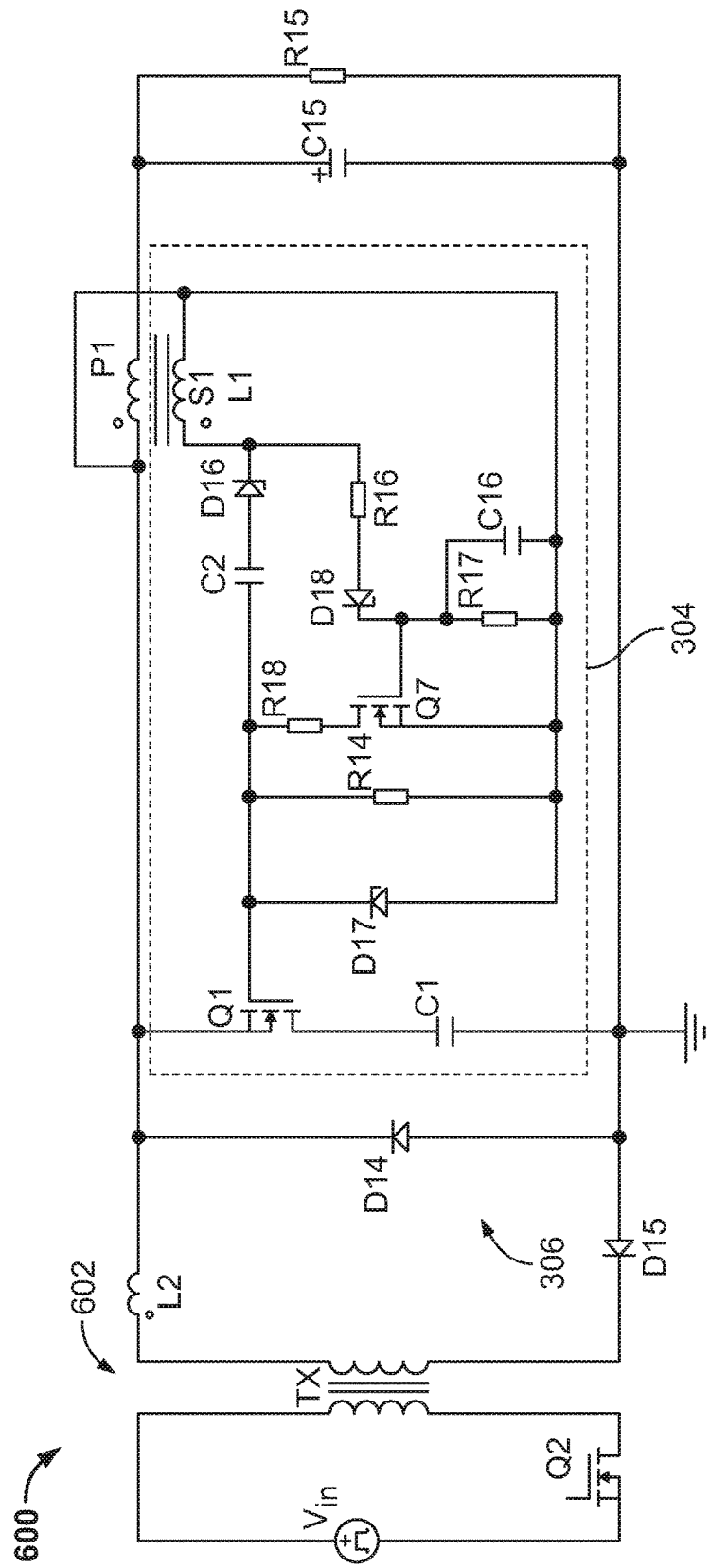
FIG. 6 is a circuit diagram of a power converter including a forward converter and a snubber circuit coupled to the forward converter according to another example embodiment.

FIG. 6 illustrates a power converter 600 substantially similar to the power converter 300. The power converter 600 includes a power conversion circuit 602 and the snubber circuit 304 of FIG. 3 coupled to the power conversion circuit 602. The power conversion circuit 602 includes a power switch Q2, a transformer TX coupled to the power switch Q2, and the rectification circuit 306 of FIG. 3 having diodes D14, D15 coupled to the output side of the transformer TX. In particular, the transformer TX is coupled between the power switch Q2 and the diodes D14, D15. Similar to the power converter 300 of FIG. 3, the inductance L2 coupled between the transformer TX and the choke L1 represents a leakage inductance of the transformer TX.

The power conversion circuit 602 of FIG. 6 is shown as a DC/DC buck converter topology. In particular, the power conversion circuit 602 includes a forward converter. Additionally and/or alternatively, the power conversion circuit 602 may include one or more other buck converter topologies such as a buck regulator, a push-pull converter, etc. and/or another suitable converter topology. Likewise, the other power conversion circuits disclosed herein may include any suitable converter topology including, for example, one or more buck converter topologies.

The power converters disclosed herein may be considered a switched-mode power supplies (SMPS) and/or a portion of SMPS. For example, a SMPS may include one or more power converters disclosed herein (e.g., the DC/DC forward converter of FIG. 6), one or more other power converters (e.g., DC/DC converters, AC/DC converters, PFC, etc.), one or more control circuits, etc.

The reference potentials disclosed herein may include a reference voltage such as chassis ground, etc. or another suitable reference potential.

By employing the snubber circuits disclosed herein, power converters may experience reduced power loss compared to other power converters including conventional snubber circuits. This can be due to, for example, using low power loss components such as transistors, etc., using existing inductance components to power the snubber circuits, etc. The reduced power loss in the snubber circuits (and therefore the power converters) can be significant when, for example, a power converter provides a low output power. In such examples, power loss of a snubber circuit in the power converter can impact the power converter's efficiency by one percent or more. This one percent difference can be significant considering high efficiency requirements of power converters.

Additionally, the snubber circuits can operate without storing energy in its auxiliary inductance. As such, power loss in the snubber circuits may be reduced compared to conventional snubber circuits that require inductance(s) to store energy.

The snubber circuits can also be employed in power converters without adding various components such as transformers (in addition to a main transformer) to absorb leakage energy, etc. In such examples, costs of manufacturing such power converters may be lower than power converters requiring the additional components.

Further, in examples where the snubber circuits are positioned in power converters including a transformer, the snubber circuits can be positioned on the secondary side of the transformer. This can reduce safety concerns about possible isolation issues as the snubber circuits are positioned entirely on the secondary side of the transformer, high voltage on the primary side of the transformer, etc.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The invention claimed is:

1. A power converter for converting an input power at an input of the converter to an output power at an output of the converter, the power converter comprising:
    a power conversion circuit including a switching device coupled to a reference potential, and an inductance coupled to the switching device; and
    a snubber circuit coupled to the power conversion circuit, the snubber circuit including a snubber switching device, a capacitance coupled to the snubber switching device, and an auxiliary inductance coupled to the inductance of the power conversion circuit and the snubber switching device, the snubber switching device and the capacitance coupled across the switching device of the power conversion circuit, the capacitance adapted to store leakage energy output from the power conversion circuit and discharge at least a portion of the stored leakage energy via the snubber switching device.

2. The power converter of claim 1 wherein the switching device includes a diode.

3. The power converter of claim 1 wherein the power conversion circuit includes at least one power switch and a rectification circuit coupled to the at least one power switch and wherein the switching device of the power conversion circuit includes a freewheeling switching device of the rectification circuit.

4. The power converter of claim 1 wherein the power conversion circuit includes a transformer coupled to the switching device.

5. The power converter of claim 4 wherein the transformer includes an input side and an output side and wherein the switching device of the power conversion circuit is coupled to the output side of the transformer.

6. The power converter of claim 4 wherein the power conversion circuit includes a forward converter.

7. The power converter of claim 4 wherein the leakage energy is provided by the transformer.

8. The power converter of claim 1 wherein the snubber circuit includes a diode coupled to the snubber switching device and adapted to clamp a voltage across the capacitance.

9. The power converter of claim 8 wherein the snubber switching device includes a transistor having a source terminal coupled to the inductance of the power conversion circuit, a drain terminal coupled to the capacitance of the snubber circuit and a gate terminal coupled to the auxiliary inductance of the snubber circuit via the diode.

10. The power converter of claim 9 wherein the capacitance is coupled between the drain terminal of the snubber switching device and the reference potential.

11. The power converter of claim 1 wherein the snubber switching device is a first snubber switching device, wherein the snubber circuit includes a second snubber switching device coupled to the first snubber switching device for controlling the first snubber switching device.

12. The power converter of claim 11 wherein during startup of the power converter, the second snubber switching device is configured to control the first snubber switching device so the capacitance is restricted from discharging stored energy via the first snubber switching device.

* * * * *